United States Patent [19]
Williamson, Jr.

[11] Patent Number: 4,779,043
[45] Date of Patent: Oct. 18, 1988

[54] REVERSED IC TEST DEVICE AND METHOD

[75] Inventor: Eddie L. Williamson, Jr., Fort Collins, Colo.

[73] Assignee: Hewlett-Packard Company, Palo Alto, Calif.

[21] Appl. No.: 89,638

[22] Filed: Aug. 26, 1987

[51] Int. Cl.$^4$ .................. G01R 31/02; G01R 31/04
[52] U.S. Cl. ................... 324/73 R; 324/73 PC; 324/158 R
[58] Field of Search ............... 340/650, 652, 653; 324/73 AT, 73 R, 73 PC, 158 R, 158 D, 158 T, 537, 525; 371/15, 21, 20, 25; 364/550

[56] References Cited

U.S. PATENT DOCUMENTS

| | | | |
|---|---|---|---|
| 3,969,670 | 7/1976 | Wu | 324/158 R |
| 3,995,215 | 11/1976 | Chu et al. | 324/158 R |
| 4,418,403 | 11/1983 | O'Toole et al. | 371/21 |
| 4,459,686 | 7/1984 | Toyoda | 365/201 |
| 4,502,140 | 2/1985 | Prolbsting | 371/21 |
| 4,504,929 | 3/1985 | Takamae et al. | 371/21 |
| 4,553,225 | 11/1985 | Ohe | 371/21 |
| 4,713,814 | 12/1987 | Andrusch et al. | 371/20 |
| 4,719,418 | 1/1988 | Flaker et al. | 324/158 R |

FOREIGN PATENT DOCUMENTS

2167196 5/1985 United Kingdom ......... 324/73 PC

Primary Examiner—Reinhard J. Eisenzopf
Assistant Examiner—W. Burns
Attorney, Agent, or Firm—William W. Cochran

[57] ABSTRACT

A system and method for unambiguously determining the orientation of a semiconductor component in a circuit. The invention draws a predetermined biasing current from the signal node of a circuit that is sufficient to forward bias protection and/or parasitic diodes that exist between the ground pin and signal pin of the semiconductor component. Hence, if all of the semiconductors coupled to a signal node are connected in proper orientation, a voltage of $-V_D$ will be detected on the signal node. A voltage of approximately two diode voltage drops is applied to the power node so that the protection and/or parasitic diodes of a semiconductor placed in the circuit in reverse orientation will be forward biased to produce a voltage on the signal node equal to approximately one diode voltage drop. Missing components and bent pins do not affect the results of the test performed by the present invention. Guarding techniques on the signal node are not required since impedances coupled to the signal node are normally high enough to allow the protection and/or parasitic diodes to be forward biased by current supplied by the current source.

5 Claims, 4 Drawing Sheets

REVERSED IC TEST DEVICE AND METHOD

BACKGROUND OF THE INVENTION

1. Field of the Invention

The present invention pertains generally to measuring and test devices and more particularly to manufacturing defect analyzers for testing digital components.

2. Description of the Background

Devices for testing printed circuit boards have typically fallen into three major categories, i.e., functional testers, in-circuit testers and manufacturing defect analyzers. Each of these three major categories of testers is briefly described below.

Functional testers comprise devices which have typically measured the output performance of a printed circuit board based on a series of input signals. Although functional testers provide an excellent way of testing the end desired performance of a particular board, they are usually incapable of determining the location of defects in the board, or components mounted on the board. As boards become larger, more complex, and costly, the chances of a defect occurring on a board, due to the many traces on the board, or one of the many components mounted thereon, increase greatly. Since functional tests merely indicate whether or not the board is operating properly and do not provide an indication of the location of a defect, the usefulness of functional testers as an overall test system is limited.

Because of the limitations of the functional testers in locating defects in boards, in-circuit test devices were developed. In-circuit test devices actually test individual components mounted on the board and test conductivity paths through the traces of the board by attaching a series of connector pins to various nodes on the circuit so that test signals can be applied to the components to determine operability. Algorithms have been developed to carefully limit the power which can be applied to components to prevent damage. Digital backdriving techniques have been integrated into the in-circuit testing scheme to allow both analog and digital components to be effectively tested in the in-circuit test devices. As circuit topologies have become more complex and the demand for faster in-circuit testers has grown, the in-circuit testing devices have become more and more expensive. This has resulted in a need for a less expensive device capable of testing simpler defects, such as open traces on a board or bent pins on a component.

Manufacturing defects analyzers were originally developed as inexpensive test devices for testing simple defects such as open circuits or short circuits on the prined circuit board. Since a high percentage of the faults on a board are produced by solder shorts between traces and other simple defects, manufacturing defect analyzers were developed to provide an inexpensive device for detecting a majority of these faults. Hence, manufacturing defects analyzers were able to fill a need for detecting simple defects on a printed circuit board without employing expensive in-circuit testing devices. Although analog testing techniques have been employed in some manufacturing defect analyzers, to date, very few have incorporated digital testing techniques because of the complexity and expense involved. Hence, manufacturing defect analyzers primarily remain as simple fault detection testers. Test Systems, Incorporated, located in Tempe, Arizona has designed several techniques for testing digital components in a simple and easy manner which can be employed in manufacturing defect analyzers. The Test System's circuit utilizes a voltage potential between the $V_{CC}$ node and the signal node which is sufficient to forward bias a single diode junction but insufficient to forward bias two diode junctions. If the IC is inserted in reversed orientation, a large amount of current will flow from the VCC node to the input/output node (signal node) indicating that the IC has been inserted in reverse orientation. However, parallel conductive paths must be carefully guarded to ensure that false readings are not obtained from the test system. The guarding techniques required by the Test Systems, Incorporated device can often times be somewhat complex and difficult to implement. Hence, a need exists for a simple method of unambiguously determining whether an IC has been placed in the circuit in proper orientation.

SUMMARY OF THE INVENTION

The present invention overcomes the disadvantages and limitations of the prior art by providing a system for unambiguously determining the orientation of a semiconductor component in a circuit. This is accomplished by providing a predetermined voltage on a power node of the circuit that is equal to approximately two diode junction voltage transitions. Additionally, a current sufficient to forward bias a single diode junction is drawn from a signal node so that a voltage equal to one diode junction voltage transition is produced by current flowing from the ground node through a diode junction coupled between the ground node and the signal connector. The advantages of the present invention are that it unambiguously identifies nodes connected to IC's that have been placed in the circuit in reverse orientation. A substantial voltage difference is produced at the signal node for reverse oriented IC's to clearly identify failing nodes. Additionally, bent pins or missing parts do not affect the test. Only reversed IC's will produce a voltage variation at the signal node. Additionally, unlike prior art devices, no guarding is needed for parallel conductive paths, especially conductive paths coupled to the signal node since a current is drawn from the signal node sufficient to forward bias diode junctions existing between the signal node and ground. The elimination of the necessity for guarding against parallel conductive paths greatly simplifies the implementation of the system.

BRIEF DESCRIPTION OF THE DRAWINGS

An illustrative and presently preferred embodiment of the invention is shown in the accompanying drawings, wherein.

DETAILED DESCRIPTION OF THE INVENTION

Figure 1:
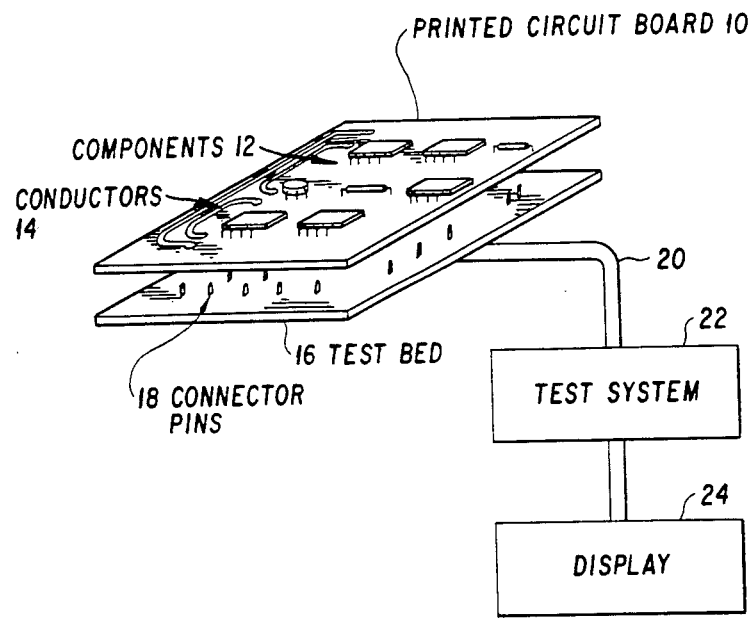
FIG. 1 comprises an overall schematic view of the test system of the present invention.

FIG. 1 is a schematic illustration showing the manner in which the present invention can be implemented in a test system. The printed circuit board 10 which is under has a plurality of components 12 which are connected to the printed circuit board 10. Conductors 14 ovide conductive traces between the various components 12. Test-bed 16 has a plurality of connector pins 18 which are aligned to connect to various nodes of conductors 14 that are to be tested by the test system of the present invention. Th connector pins 18 are coupled to a series of conductors 20, which are in turn, connected to test system 22. Test system 22 comprises a programmable computer or state logic device that is connected to the necessary drivers for generating currents and voltages, and the necesssary detectors, comparators and other circuitry needed to perform the test functions of the present invention. The test system processes the information and displays results on display 24. Typically, failed nodes are compared with the conductivity information which is supplied to test system 22 to indicate specific IC's which have been placed in the circuit in reverse orientation.

Figure 2:
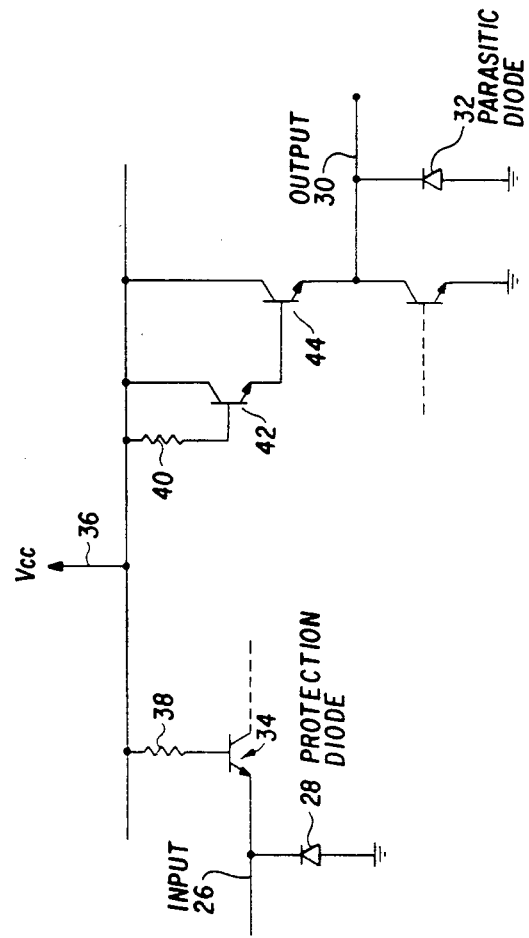
FIG. 2 discloses a typical schematic partial circuit diagram comprising a device under test.

FIG. 2 is a schematic illustration of a typical semiconductor circuit that comprises a device under test (DUT) that is being analyzed to determine if the DUT has been placed in the circuit in reverse orientation. Typically, the pin layout of the semiconductor is such that the ground pin and power pin of the semiconductor are on corresponding positions on opposite sides of the semiconductor. Hence, if the semiconductor is placed in the circuit in reverse orientation, the ground pin will be connected to the power node of the circuit while the power pin will be connected to the ground node of the circuit. Some symmetry of the semiconductor circuit provides a way of detecting if the IC has been placed in the circuit in reverse orientation.

Referring to FIG. 2, input 26 is coupled to ground through a protection diode 28 which comprises a discrete component designed in the semiconductor circuit. In a similar manner, output 30 is coupled to ground with a parasitic diode 32 that is produced between the substrate and the output as a result of the manufacturing process. The base/emitter junction of transistor 34 provides a single diode junction between power pin ($V_{CC}$) 36 and input 26 that is connected in series with resistor 38. Similarly, resistor 40 is connected in series with the base/emitter junction of transistor 42, which is in turn connected in series with the base/emitter junction of transistor 44 between power pin 36 and output 30. The equivalent circuit for the device of FIG. 2 is more fully set forth in FIG. 4.

Figure 3:
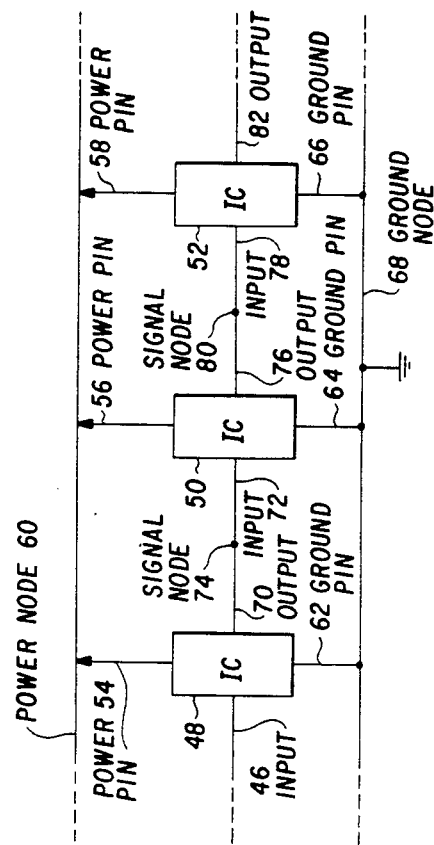
FIG. 3 schematically illustrates one possible circuit topology for the devices under test.

FIG. 3 is a schematic illustration disclosing the manner in which a number of integrated circuits may be connected in series in a circuit topology on a printed circuit board 10. Although FIG. 3 illustrates one manner in which a plurality of integrated circuits such as illustrated in FIG. 2, may be connected, many other topologies may exist including fan-out nodes (Bus topologies) which are equally applicable for use with the present invention. As shown in FIG. 3, input 46 of IC 48 can be coupled to other components or other integrated circuits within the circuit topology. IC's 48, 50 and 52 have power pins 54, 56 and 58, respectively, that are coupled to power nodes 60. Similarly, ground pins 62, 64 and 66 of IC's 48, 50 and 52, respectively, are connected to ground nodes 68. As shown in FIG. 3, output 70 of IC 48 is connected to input 72 of IC 50 at a signal node 74 of the circuit. Similarly, output 76 of IC 50 is connected to input 78 of IC 52 at signal node 80 of the circuit. Output 82 of IC 52 may be connected to one or more additional IC's or other components of the circuit.

Figure 4:
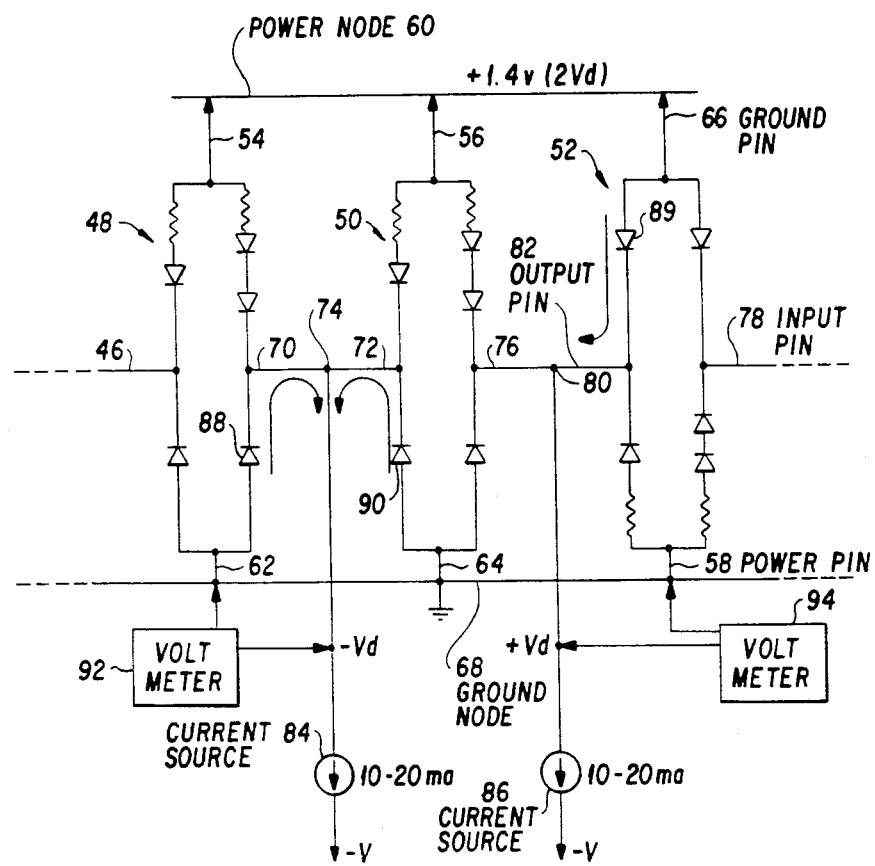
FIG. 4 is a schematic illustration of an equivalent circuit showing the devices under test in the circuit topology illustrated in FIG. 3.

FIG. 4 is a schematic diagram illustrating the equivalent circuit of FIG. 2 for IC 48, IC 50 and IC 52 connected in the circuit topology illustrated in FIG. 3 with the exception that semiconductor 52 is connected to the circuit in reverse orientation. The test system of the present invention utilizes a signal source 84 which draws a bias current of approximately 10 to 20 milliamps which is sufficient to forward bias diode junctions 88 and 90 which exist between the ground pin 62 and output pin 70 of integrated circuit 48 and the ground pin 64 and input pin 72 of integrated circuit 50. Diode junction 88 comprises a parasitic diode while diode junction 90 comprises a protection diode. The current which is drawn through the diodes 88 and 90 from signal node 74 produces a single diode junction voltage drop ($-V_D$) which is measured by voltmeter 92. Simultaneously, a voltage of approximately 1.4 volts is applied to power node 60 which is equal to approximately two diode voltage drops ($2\,V_D$). The voltage on power node 60 is insufficient to forward bias the diodes of semiconductors 48 or 50 between power node 60 and signal node 74 because of the resistance which is in series in the signal paths between power node 60 and signal node 74. Hence, a measurement of minus one diode voltage drop ($-V_D$) by voltmeter 92 provides an indication that both semiconductors 48 and 50, coupled to signal node 74, are connected to the circuit in proper orientation. Of course, any number of semiconductors, such as semiconductors 48 and 50 can be coupled to a single signal node, such as signal node 74, without degrading the performance of the present invention. Additionally, as can be readily seen from the circuit illustrated in FIG. 4, either semiconductor 48 or 50 could be missing from the circuit and the device of the present invention would still operate equally as well. Consequently, missing components do not degrade the performance of the present invention.

Semiconductors placed in the circuit in reverse orientation are detected in a slightly different manner. Referring to semiconductor 52 of FIG. 4, the voltage applied to power node 60 is approximately two diode voltage drops, i.e., approximately 1.4 volts. Because semiconductor 52 is in reverse orientaton, a diode junction 89 is coupled between the ground pin 66 and output pin 82 of semiconductor 52. As a result, diode junction 89 is forward biased by the voltage applied to power node 60. The voltage applied to power node 60 comprising two diode voltage drops ($+2\,V_D$) is used as a matter of convenience. Of course any voltage level sufficient to forward bias a single diode junction when the IC is placed in the circuit in reverse orientation is needed at power node 60, provided that the voltage level at power node 60 is less than that required to forward bias the diodes between power node 60 and any signal node when a semiconductor is placed in the circuit in proper orientation. Since diode junction 89 is forward biased, the voltage on power node 60 appears on signal node 80. This results in a single diode junction voltage drop across protection diode 89 so that a voltage level of $+V_D$ is detected at signal node 80 by voltmeter 94. Consequently, if any semconductor component, such as semiconductor component 52, is placed in the circuit in reverse orientation, a voltage of $+V_D$ will be detected at signal node 80, rather than a voltage of $-V_D$ at a signal node such as signal node 74 to which all semiconductors are connected in proper orientation. A comparison of the connectivity charts and the failing nodes ides an indication of which IC's within the circuit
e been placed in the circuit in reverse orientation.

Again, if either semiconductor component 50 or 52 were missing from the circuit, the performance of the device of the present invention would not be degraded since only semiconductor components which are placed in the circuit in reverse orientation cause a $+V_D$ voltage reading at the signal node. This comprises a significant advantage over prior art devices that are affected by bent pins and missing components.

Consequently, the present invention provides a simple and inexpensive device that can be used to supplement manufacturing defect analyzers to determine if a semiconductor component has been placed in a circuit in reverse orientation. These results are obtained in an unambiguous manner and are not affected by missing components or bent pins. Guarding techniques are not necessary on the signal nodes since a current is being drawn from the signal node to forward bias the protection and parasitic diodes of properly oriented semiconductors. Impedances that are coupled to the signal node are normally great enough to prevent sufficient sinking of current from the signal node that would prevent forward biasing of these diodes. The elimination of the necessity for guarding, as required in prior art devices, greatly simplifies the implementation of the present invention.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the princples of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of determining the orientation of semiconductor components in a circuit that are coupled to a common signal node and a common power node of said circuit comprising the steps of:
   maintaining a first voltage level on said power node that is less than the voltage level necessary to forward bias any diode junctions of said semiconductor components coupled between said power node and said signal node whenever said semiconductor components are properly oriented in said circuit and sufficient to forward bias diode junctions of said semiconductor components coupled between said power node and said signal node whenever said semiconductor components are connected to said circuit in reverse orientation;
   providing a current at said signal node that is sufficient to forward bias diode junctions of said semiconductor components between a ground node of said circuit and said signal node whenever said semiconductor components are properly oriented in said circuit;
   measuring the voltage level at said signal node to provide an indication of the orientation of said semiconductor components such that a first predetermined output voltage at said signal node indicates that said semiconductor components are properly oriented in said circuit, and a second predetermined output voltage at said signal node indicates that at least one of said semiconductor components is coupled to said circuit in reverse orientation.

2. A method of determining the orientation of semiconductor components of a circuit that have ground connectors designed to be connected to a ground node of said circuit, signal connectors that are designed to be connected to signal nodes of said circuit and power connectors that are designed to be connected to power nodes of said circuit comprising the steps of:
   applying a predetermined supply voltage to said power node of said circuit having a level sufficient to forward bias any diode junctions coupled between said power node and said signal node of any of said semiconductor components connected in reverse orientation in said circuit to produce a first predetermined output voltage at said signal node;
   applying a current to said signal node of said circuit sufficient to forward bias any diode junctions between said signal node and said ground node of said circuit of said semiconductor components whenever said semiconductor components are connected in proper orientation in said circuit to produce a second predetermined output voltage at said signal node;
   measuring said first and second predetermined output voltages at said signal node to determine if any of said semiconductor components connected to said signal node are connected to said circuit in reverse orientation.

3. A system for determining the orientation in a circuit of semiconductor components having signal connectors, power connectors and ground connectors comprising:
   signal node means for providing a common signal connection for said signal connectors of said semiconductor components to said circuit;
   power node means for providing a common power supply connection for said power connectors of said semiconductor components to said circuit;
   ground node means for providing a common ground connection for said ground connectors of said semiconductor components to said circuit;
   first diode junction means of said semiconductor components coupled between said power connectors and said signal connectors;
   second diode junction means of said semiconductor components coupled between said ground connectors and said signal connectors;
   voltage supply means for applying a predetermined supply voltage to said power node means sufficient to forward bias said second diode junction means such that a first predetermined output voltage is produced at said signal node means whenever at least one of said semiconductor components is connected to said circuit in reverse orienation;
   current supply means for providing a predetermined bias current to said signal node sufficient to forward bias said first diode junction means such that a second predetermined output voltage is produced at said signal node means whenever said semiconductor components connected to said signal node are connected to said circuit in proper orientation.

4. A system for determining the orientation of semiconductor components in a circuit comprising:

signal node means for providing a common signal connection in said circuit for signal connectors of said semiconductor components;

power node means for providing a common power supply connection in said circuit for power connectors of said semiconductor components;

ground node means for providing a common ground connection in said circuit for ground connectors of said semiconductor components;

first diode junction means of said semiconductor components coupled between said power connectors and said signal connectors;

second diode junction means of said semiconductor components coupled between said ground connectors and said signal connectors;

voltage supply means for maintaining a predetermined supply voltage on said power node means that is insufficient to forward bias said first diode junction means between said power node means and said signal node means but sufficient to forward bias said second diode junction means between said power node means and said signal node means;

current source means connected to said signal node means for producing a current that is sufficient to forward bias said second diode junction means between said ground node means and said signal node means and between said power node means and said signal node means but insufficient to forward bias said first diode junction means between said ground node means and said signal node means and between said power node means and said signal node means;

detector means for measuring a first predetermined output voltage at said signal node means whenever said semiconductor components are aligned in a first orientation in said circuit caused by said current from said current source means flowing through said first diode junction means and a second predetermined output voltage at said signal node whenever at least one of said semiconductor components is aligned in a second orientation in said circit caused by said predetermined supply voltage forward biasing said second diode junction means.

5. The system of claim 4 wherein said predetermined supply voltage is approximately equal to two diode junction voltage transitions such that said first predetermined voltage is approximately equal to a negative diode junction voltage transition and said second predetermined voltage is approximately equal to a positive diode junction voltage transition.

* * * * *